(12) United States Patent
Son (10) Patent No.: US 9,983,744 B2
(45) Date of Patent: May 29, 2018

(54) CAPACITIVE TACTILE SENSOR WITH NESTED MATRIX ELECTRODES

(71) Applicant: Pressure Profile Systems Inc., Los Angeles, CA (US)

(72) Inventor: Jae S. Son, Rolling Hills Estates, CA (US)

(73) Assignee: Pressure Profile Corp., Los Angeles, CA (US)

( * ) Notice: Subject to any disclaimer, the term of this patent is extended or adjusted under 35 U.S.C. 154(b) by 243 days.

(21) Appl. No.: 14/846,965

(22) Filed: Sep. 7, 2015

(65) Prior Publication Data

US 2017/0010707 A1 Jan. 12, 2017

Related U.S. Application Data

(60) Provisional application No. 62/189,461, filed on Jul. 7, 2015.

(51) Int. Cl.
| | |
|---|---|
| *G01L 1/00* | (2006.01) |
| *G06F 3/044* | (2006.01) |
| *G06F 3/041* | (2006.01) |
| *H05K 1/02* | (2006.01) |

(52) U.S. Cl.
CPC ............ *G06F 3/044* (2013.01); *G06F 3/0414* (2013.01); *H05K 1/0296* (2013.01); *G06F 2203/04112* (2013.01); *H05K 2201/0145* (2013.01); *H05K 2201/0154* (2013.01); *H05K 2201/10151* (2013.01)

(58) Field of Classification Search
CPC ....... G06F 3/044; G06F 3/0414; G01L 1/142; G01L 3/24; G01B 7/16; G01B 7/18; G01B 5/30; G01N 27/223

USPC .......... 73/780, 774, 763, 760, 862; 361/280
See application file for complete search history.

(56) References Cited

U.S. PATENT DOCUMENTS

| | | | | |
|---|---|---|---|---|
| 2013/0106777 | A1* | 5/2013 | Yilmaz | G06F 3/03545 345/174 |
| 2014/0111464 | A1* | 4/2014 | Bakken | G06F 3/0416 345/174 |
| 2014/0354585 | A1* | 12/2014 | Cok | G06F 3/0414 345/174 |
| 2014/0375570 | A1* | 12/2014 | Cok | G06F 3/0416 345/173 |

(Continued)

*Primary Examiner* — Manish S Shah
*Assistant Examiner* — Nigel Plumb
(74) *Attorney, Agent, or Firm* — Boris Leschinsky (57) ABSTRACT

A capacitive tactile sensor for measuring location and force of touch from an external object includes a drive electrode layer separated from a sense electrode layer by a dielectric substrate, which may be a two-sided FPCB. A first deformable conductive shield layer is further provided and is separated from either the drive electrode layer or the sense electrode layer by a first compressible dielectric layer. A control electronics are operatively connected to all of the drive electrode layer, sense electrode layer, and the first conductive shield layer. The control electronics may be configured to measure a change in capacitance upon the external object imparting local mechanical compression onto the first conductive shield layer and the first compressible dielectric layer. The tactile sensor improves reliability of interconnections between drive and sense electrodes and the control electronics.

19 Claims, 10 Drawing Sheets

(56) References Cited

U.S. PATENT DOCUMENTS

| | | | |
|---|---|---|---|
| 2014/0375590 A1* | 12/2014 | Cok | G06F 3/044 345/174 |
| 2015/0035783 A1* | 2/2015 | Brillant | G06F 3/0416 345/174 |
| 2015/0062019 A1* | 3/2015 | Fredriksen | G06F 3/041 345/173 |

* cited by examiner

CAPACITIVE TACTILE SENSOR WITH NESTED MATRIX ELECTRODES

CROSS REFERENCE DATA

This application claims priority date benefit from a U.S. Provisional Patent Application No. 62/189,461 filed 7 Jul. 2015 with the same title and incorporated herein in its entirety by reference.

BACKGROUND

The present invention relates generally to tactile sensors. More particularly, the invention describes capacitive tactile sensors which combine elements of traditional touch sensors and traditional tactile sensor in a novel way.

Traditional capacitive tactile sensors feature arrays of electrodes having two layers of electrodes (typically columns and rows) that need to be connected to control electronics. The layers are separated by a compressible dielectric layer. Control electronics for measuring capacitance may be incorporated into ASICs, which makes it much easier to develop smaller compact sensor electronic solutions.

Capacitive tactile sensors are used to measure both the location of touch as well as touch force or pressure distribution at that location. There are two types of capacitive tactile sensors. A discrete element capacitive tactile sensor typically has one element for one input channel on the capacitance-sensing integrated circuit (IC). A multiplexed array capacitive tactile sensor on the other hand uses an array of a plurality of electrode rows and separate electrode columns to maximize the number of sensing elements while minimizing the number of interconnections to the capacitance-sensing IC.

In essence, mechanical deformation of the compressible layer is detected by changing capacitance between adjacent electrode layers and translated by the control electronics into location and force of touch. In that sense, capacitive tactile sensors respond to a mechanical deformation from an external object.

While fabricating flexible tactile sensors, reliability of interconnections becomes a weak point in the design since the sensor electrodes are often fabricated using conductive materials that are different than copper-clad polyimide flexible printed circuit boards (FPCB). Even when the same FPCB is used, the interconnection between the two layers of electrodes and the control electronics is a weak point for sensor reliability. For the purposes of this description, the term "flexible printed circuit board" or FPCB is used to broadly depict a flexible polymer dielectric substrate on which a plurality of electrodes is placed using any known deposition manufacturing methods. Examples of such methods include printing, photolithographing techniques, laminating electrodes in between polymer films, bonding, and other methods known in the art. Included in the definition of the term "flexible printed circuit board" are printed electronics made with common printing equipment suitable for defining patterns on substrate material, such as screen printing, flexography, gravure, offset lithography, and inkjet. The term "flexible printed circuit board" is used to depict one-sided or two-sided designs of flexible circuits with electrodes placed correspondingly on one or both sides of the flexible polymer substrate. Further included in the term "flexible printed circuit board" are double access flex circuits, back bared flex circuits, sculptured flex circuits, multi-layer flex circuits, roll-able electronics, stretchable electronics, organic electronics, plastic electronics, rigid-flex circuit hybrids, flex circuits with one of more metals used as conductors and other known designs in the art of flexible circuits.

Figure 1:
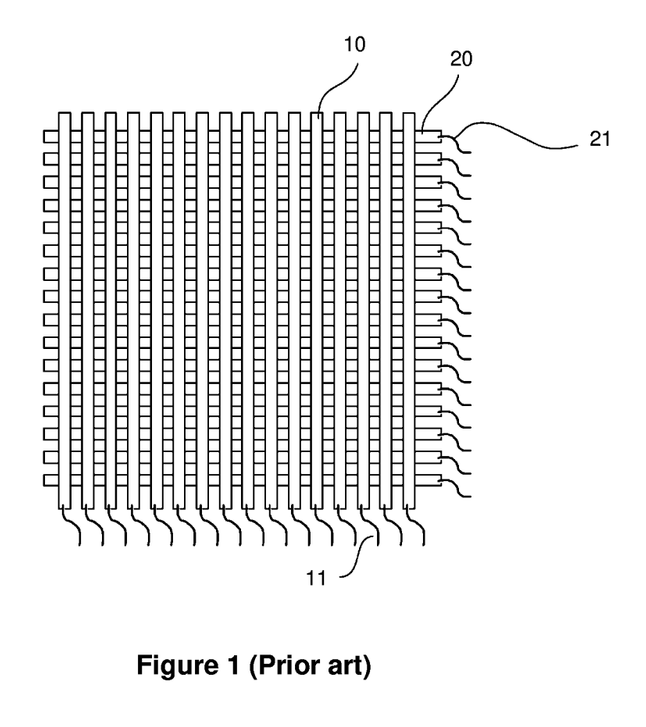
FIG. 1 shows prior art capacitive tactile sensor where conductive cloth electrodes are directly connected to electrical wires as interconnections to control electronics.
Figure 2:
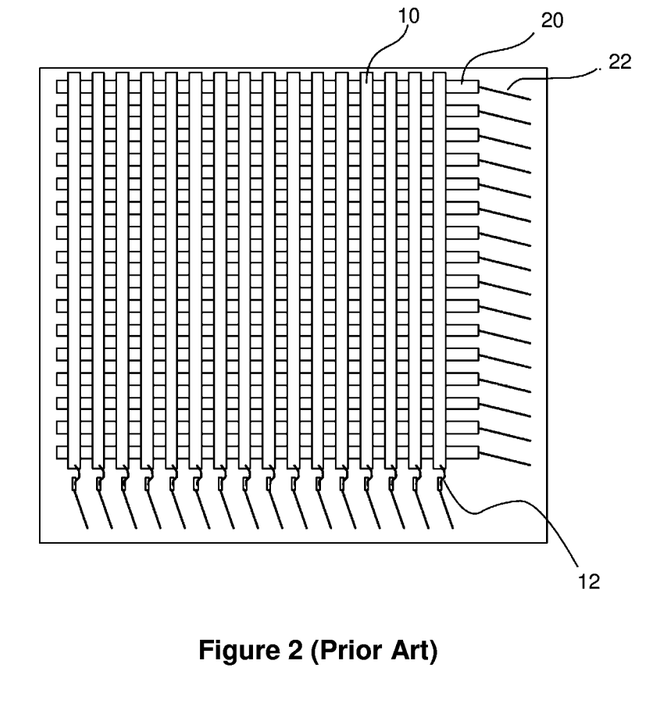
FIG. 2 shows prior art design of the same where one of the electrodes is directly attached on a FPCB while the other conductive cloth electrode has jumper wires to the FPCB.

The array of electrodes for the capacitive tactile sensor employs a plurality of individual column 10 and row 20 electrodes as seen in FIG. 1. Column 10 electrodes are typically connected to the control electronics using individual interconnections 11 made as electrical wires, while row 20 electrodes are connected to same using individual interconnection wires 21. FIG. 2 shows another prior art capacitive sensor array in which electrodes of rows 20 are directly attached to a FPCB using interconnections 22 while electrodes of columns 10 use jumper wires 12 to connect to the FPCB.

Typically, the width of the electrode strip in these capacitive tactile sensors is selected to be close to the gap between adjacent fine conductors. That is done to maximize the capacitance between the drive and the sense electrode.

A shield layer may also be used in order to protect the sensor from electrical interference since the purpose of a tactile sensor is to measure the mechanical contact pressure distribution.

Capacitive touch sensors are different from the capacitive tactile sensors in that they do not contain any mechanically deformable layers. These sensors work on the principle of detecting an attenuation of the coupling field formed between the drive and sense electrode layers when a conductive object is present in their vicinity, such as a human finger. In this sense, capacitive touch sensors operate as electric activity sensor—they are not responsive to mechanical deformation of any of their layers. An example of a prior art capacitive touch sensor can be found in U.S. Pat. No. 8,599,150 incorporated herein in its entirety by reference.

Capacitive touch sensors are not deformable and because of that they can only be used to detect the location of touch and not the force of touch or pressure distribution. Capacitive touch sensors do not have a compressible dielectric layer inbetween drive and sense layers of electrodes so the electrodes for both drive and sense sides may be applied to a two-sided FPCB. This greatly improves reliability of interconnections with the control electronics and simplifies production of such sensor.

Electric patterns for touch sensor electrodes vary widely—between a "checkered board" pattern to a multiple strip electrodes with large gaps between adjacent conductors. Capacitive touch sensors use different electrode patterns from capacitive tactile sensors, which employ wide strips as array electrodes. Another difference is that a capacitive touch sensor does not employ a distinct conductive shield since the human finger or another grounded or conductive object is the shield in itself that disrupts the electrical coupling fields between the drive and the sense electrodes. This is the reason why a capacitive touch sensor does not work when a user is wearing a non-conductive glove. This prompted glove manufacturers to develop gloves with conductive finger tips to allow operation of a traditional capacitive touch sensor.

The need therefore exists for a capacitive tactile sensor capable of measuring both the location of touch as well as a force of touch with high resolution and improved reliability of interconnections between the array and the control electronics, especially when using flexible surfaces.

SUMMARY

Accordingly, it is an object of the present invention to overcome these and other drawbacks of the prior art by providing a novel capacitive tactile sensor configured to detect location and force of touch from an external object regardless of whether such external object is non-conductive, conductive or grounded.

It is another object of the present invention to provide a capacitive tactile sensor responding only to mechanical deformation thereof and not affected by the presence of a grounded external object in the vicinity thereof.

It is a further object of the present invention to provide a capacitive tactile sensor with improved reliability of interconnections between electrodes thereof and control electronics.

It is yet a further object of the present invention to provide a capacitive tactile sensor allowing a simplified manufacturing using a two-sided flexible printed circuit board to support its electrodes array.

A capacitive tactile sensor of the invention may be configured for measuring location of touch and force of touch imparted by an external object. The tactile sensor may include an array of electrodes with a drive electrode layer separated from a sense electrode layer by a dielectric substrate, which may be a flexible layer of non-compressible polymer, for example a two-sided flexible printed circuit board. At least one the drive electrode layer or the sense electrode layer in turn may include a plurality of individual electrodes, for example arranged as rows and columns. Each row or column may in turn include a plurality of individual electrodes in turn comprising three or more parallel fine conductors.

The capacitive tactile sensor of the invention may further include a first deformable conductive shield layer separated from either the drive electrode layer or the sense electrode layer by a first compressible dielectric layer. Finally, the capacitive tactile sensor features a control electronics operatively connected to all of the drive electrode layer, sense electrode layer, and the first conductive shield layer. The control electronics may be configured to measure a change in capacitance upon the external object imparting local mechanical compression onto the first conductive shield layer and the first compressible dielectric layer.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION OF THE PREFERRED EMBODIMENT OF THE INVENTION

The following description sets forth various examples along with specific details to provide a thorough understanding of claimed subject matter. It will be understood by those skilled in the art, however that claimed subject matter may be practiced without one or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Figure 3:
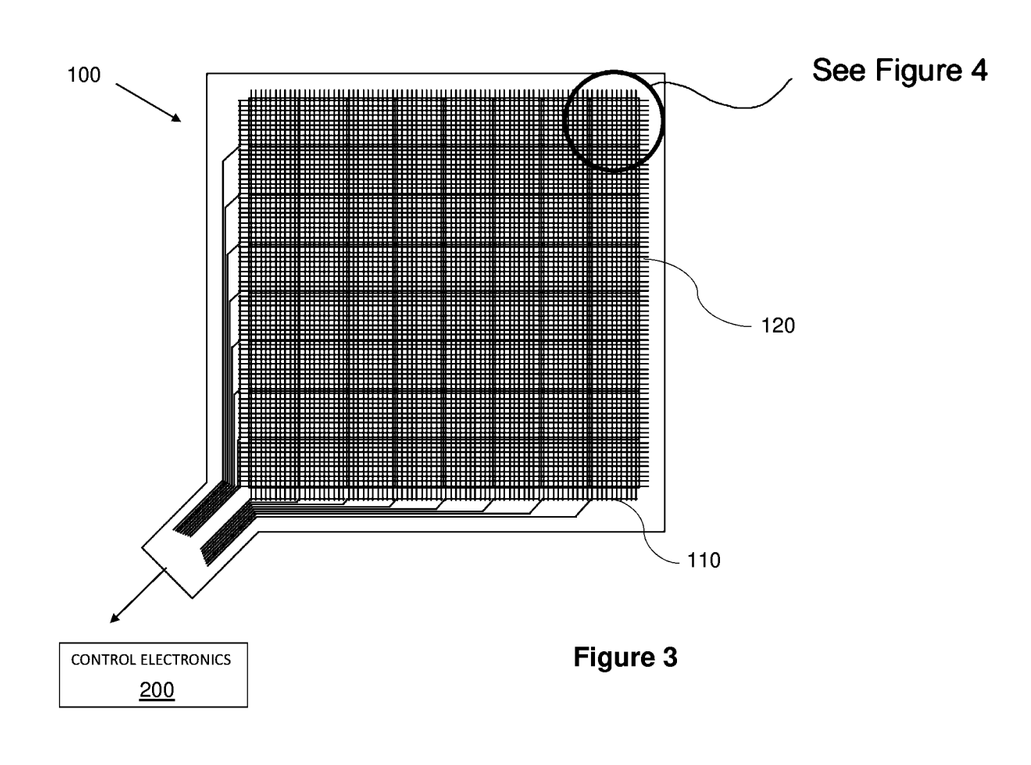
FIG. 3 shows a general top view of the nested matrix capacitive tactile sensor of the invention.
Figure 4:
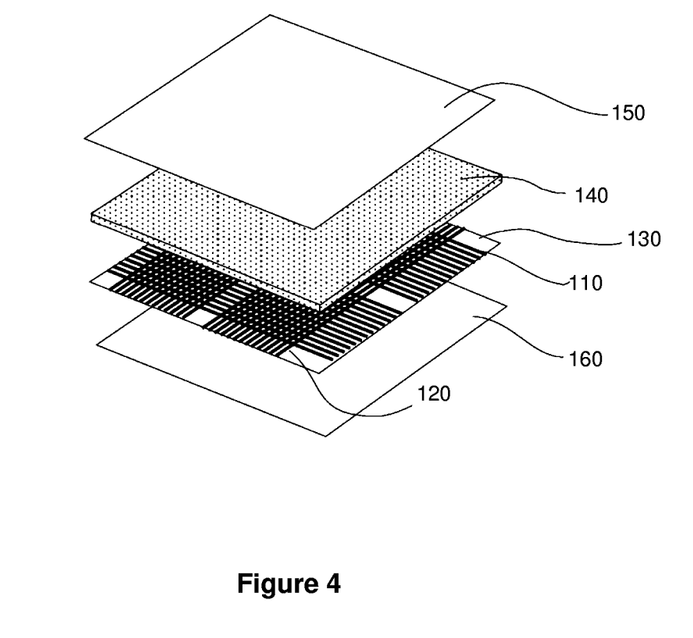
FIG. 4 shows the enlarged depiction shown in a circle in FIG. 3.

FIG. 3 shows a general top view and FIG. 4 shows a close-up view of the nested matrix capacitive tactile sensor of the invention. The tactile sensor 100 may include an array of electrodes with a drive electrode layer 120 separated from a sense electrode layer 110 by a dielectric substrate 130, which may be a flexible layer of non-compressible polymer, for example a two-sided flexible printed circuit board. In embodiments, the dielectric substrate 130 may be a thin rigid or flexible polymer film made for example using one or more layers of such polymers as a polyester polymer, a PEEK polymer, a polyimide polymer, and a polyethylene terephthalate polymer. In embodiments, the thickness of the dielectric substrate 130 may be selected to be from about 10 microns to about 100 microns. The dielectric substrate 130 may be a continuous layer of film or have opening therein—as long as such openings do not preclude proper functionality of the electrodes placed on one or both sides thereof.

In further embodiments, the electrodes of one or both the drive electrode layer 120 and the sense electrode layer 110 may be etched, painted, printed with conductive ink or otherwise positioned on one or both sides of the dielectric substrate 130.

In alternative embodiments (not shown), another carrying substrate may be used to first position one of the drive 120 or sense 110 electrode layers thereon. A thin isolating layer can be sprayed, painted, or otherwise deposited over the first electrode layer, and then the second electrode layer may be deposited over the first electrode layer so as to form an array of electrodes for the tactile sensor of the present invention.

The capacitive tactile sensor of the invention may further include a first deformable conductive shield layer 150 separated from either the drive electrode layer 120 or the sense electrode layer 110 by a first compressible dielectric layer 140. The conductive shield layer 150 may be made using various suitable conductive materials such as conductive cloth, copper, silver, gold, conductive rubber or silicone, or aluminum film. Conductive shield layer 150 may be either sputtered, rolled or plated onto the sensor assembly. The thickness of conductive shield 150 may be less than 0.01" and standard manufacturing processes may be used to fabricate the shield depending on the selected material.

The first compressible dielectric layer 140 may be selected to have a thickness ranging from about 50 microns to about 200 microns. It may be made from a foam material such as polyurethane or silicone rubber. Depending on selected performance requirements, the dielectric material of the layer 140 may be molded directly onto the electrodes or applied with transfer adhesive films.

At least one of the drive electrode layer 120 or the sense electrode layer 110 in turn may include a plurality of individual electrodes, for example arranged as rows and columns. Each row or column may in turn include a plurality of individual electrodes in turn comprising three or more parallel fine conductors.

Figure 5:
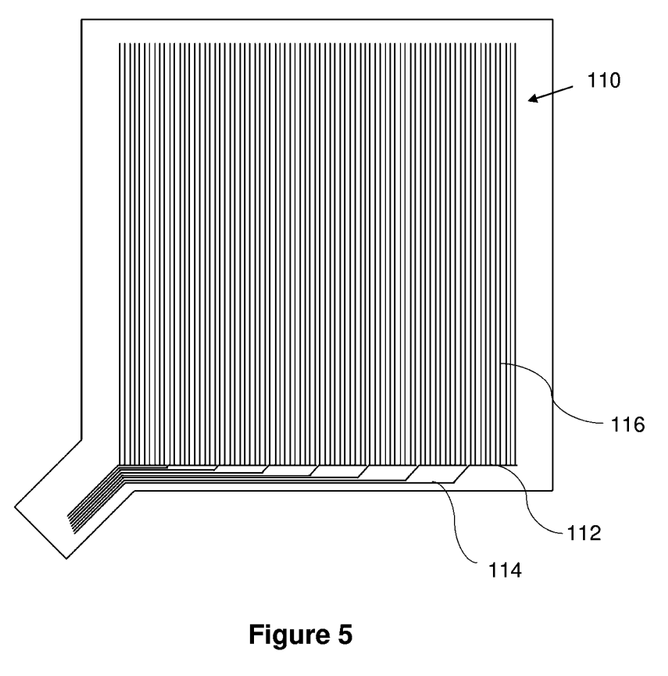
FIG. 5 shows the sense electrodes on the bottom of the FPCB.

FIG. 5 shows only the sense electrodes layer 110 on the bottom of the FPCB. In this exemplary drawing there is shown 8 groups of electrodes 112, each group comprising 10 parallel fine conductors 116, combined together at the base of the group and equipped with a single electrode 114 laid out to provide electrical connection of all electrodes of this group to the control electronics of the entire sensor. In embodiments, at least one or more electrodes may have a width of between about 25 microns to about 100 microns, a gap between adjacent fine conductors may be selected to be between about 25 microns to about 100 microns, and the number of fine conductors per electrode may vary from 3 to 50 or even greater in some circumstances. More electrodes may be used to increase the resolution of the sensor assembly—but at the expense of more difficult manufacturing techniques.

Importantly, the ratio of fine conductor width to gap between adjacent conductors may be selected from about 0.5 to about 1.5, which is typical for this nested matrix tactile sensor but drastically different for touch screens. In touch screens, fine conductors are placed with a much wider gap in between so as to not reduce transparency of the device. In touch screens, that ratio may be as little as 0.01 or less. Having the width or the fine conductor be close in size to the gap between conductors separates the present invention from known touch screens of the prior art.

The concept of grouping electrodes and providing a single combined electrode to connect to control electronics may be used to achieve the high resolution while minimizing connections between the array and the control electronics of the sensor. This arrangement may also provide for improved reliability of the sensor, especially in case of flexible fabric and flexible circuit board designs.

In embodiments, not all drive and sense electrodes have to be made this way. A combination of solid electrodes with electrodes shown in FIGS. 4-6 may be used, either for one or both the drive 120 and sense 102 electrodes. Furthermore, a single capacitive tactile sensor of the invention may use a combination of various electrode designs.

Figure 6:
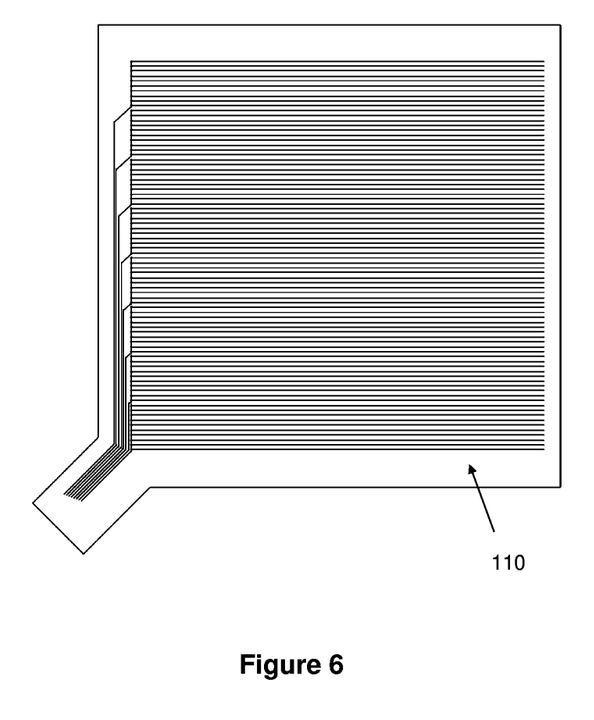
FIG. 6 shows the drive electrodes on the top of the FPCB.
Figure 7:
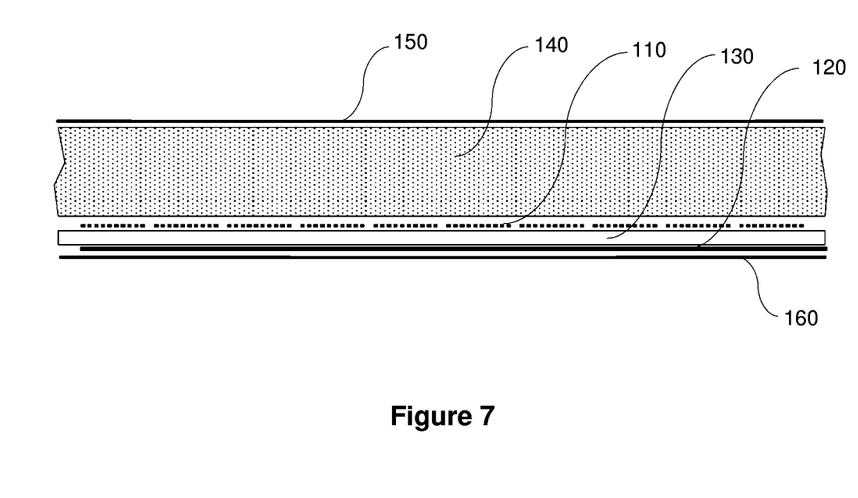
FIG. 7 shows the side view of a cross-sectional profile of the entire sensor assembly.

FIG. 6 shows the same arrangement for drive electrodes layer 120. FIG. 7 shows the side view of a cross-sectional profile of the entire sensor assembly.

In at least some embodiments, a second electrical shield 160 may be provided on the opposite side of the electrodes array.

Finally, the capacitive tactile sensor features a control electronics 200 (see FIG. 3) operatively connected to all of the drive electrode layer 120, sense electrode layer 110, and at least the first conductive shield layer 150. The control electronics 200 may be configured to measure a change in capacitance upon the external object imparting local mechanical compression onto the first conductive shield layer 150 and the first compressible dielectric layer 140.

Figure 8:
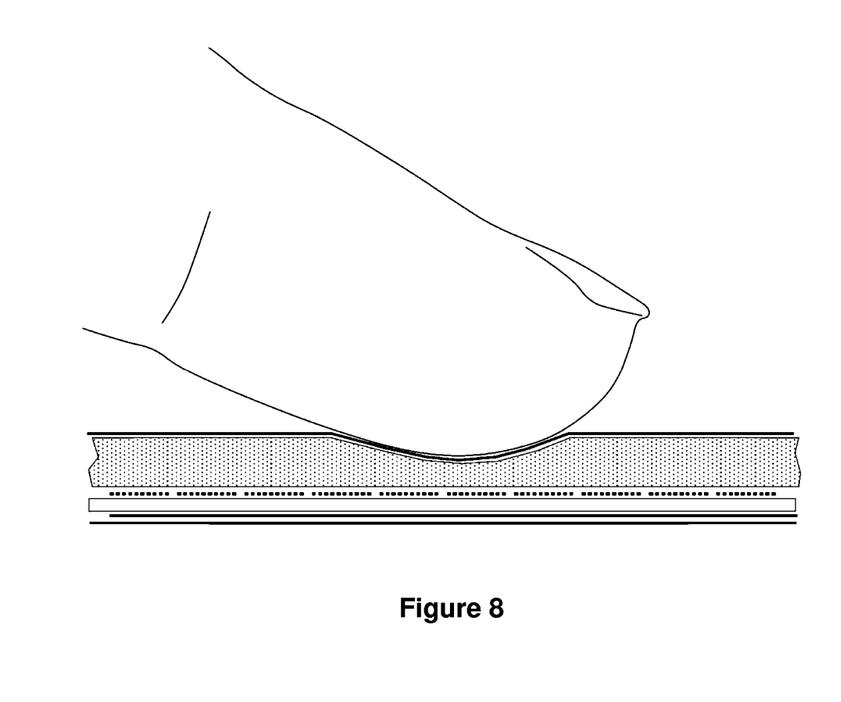
FIG. 8 shows same but with a finger is applying force to the sensor causing compression of the ground shield layer and the compressible dielectric layer.

FIG. 8 shows the sensor assembly in cross-section with a finger of a user applying force to the sensor. Deflecting the top conductive shield 150 causes compression of the first compressible dielectric layer 140. This in turn disturbs a previously established conductive field formed by energizing both drive 120 and sense 110 electrode at a place of finger contact. Importantly, the first deformable conductive shield 150 insulates the sensor from the influence of external conductive objects located near its surface and in that sense makes the impact of touching the sensor by a conductive, grounded or dielectric external object the same.

Upon depression of the first compressible layer 140, the control electronics 200 may be configured to detect the location of touch by the external object (such as a finger) as well as the compression force based on the degree of conductive field attenuation detected by control electronics 200. Deeper compression will cause greater attenuation of the conductive field. The sensor may be calibrated ahead of time by imparting controlled depression and measuring resulting attenuation of the conductive field. Such attenuation may depend on the sensor design, spacing and number of electrodes, compressibility and thickness of the first compressible dielectric layer 140 and a number of other parameters.

Individual designs of specific sensors configured for desired applications may be supplemented with such calibration data so that control electronics 200 may be adjusted in a suitable way.

The control electronics may be typically designed using an ASIC that has a multiplexing circuit along with a capacitance-to-digital converting circuit. The digital output from the array sensor may be further simplified by the use of a microcontroller that may be configured to reject non-touch signals as well as identify finger and palm contact.

Figure 9:
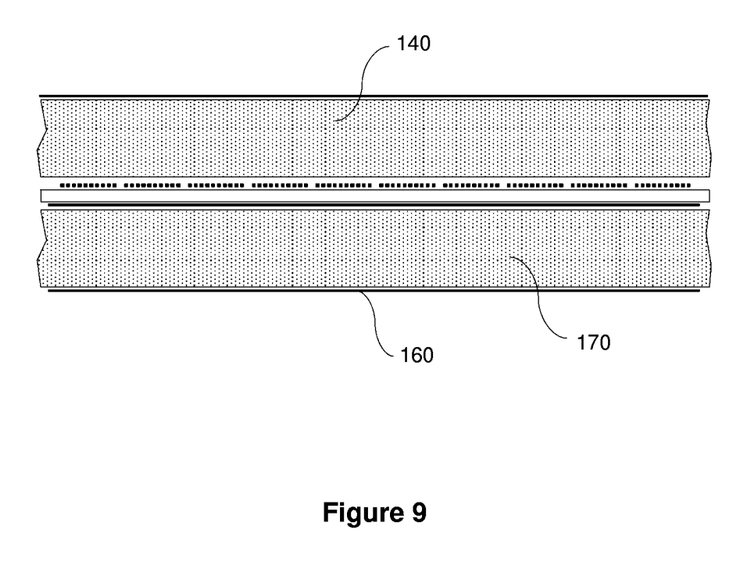
FIG. 9 shows an alternate configuration with two compressible dielectric layers mounted on both sides of the drive/sense electrodes assembly.
Figure 10:
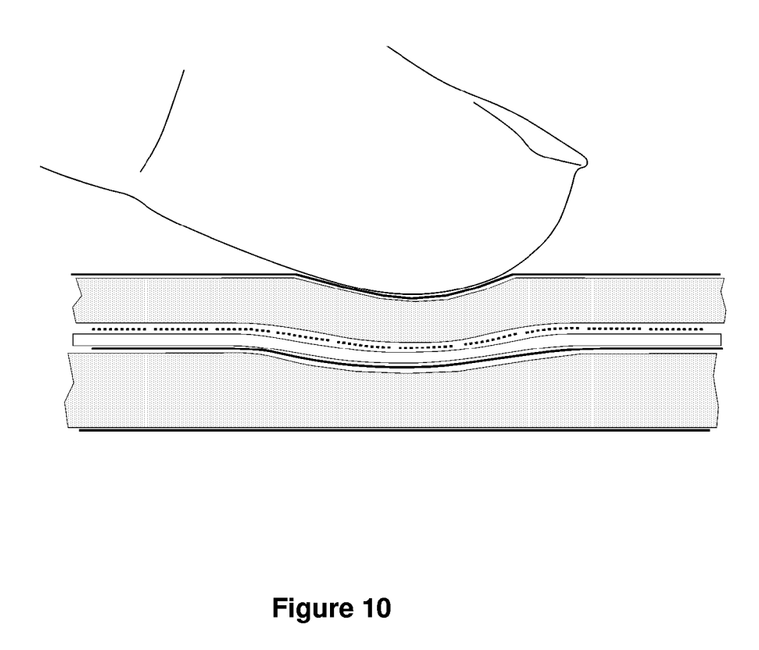
FIG. 10 shows the design of the sensor in FIG. 9 in action when compressed by a touching finger causing deformation of both compressible layers.

FIGS. 9 and 10 show an alternate configuration of the sensor with a first 140 and a second 170 compressible dielectric layers mounted on both sides of the drive/sense electrodes assembly in order to increase the amount of capacitance change with the same applied force. As can be seen in FIG. 10, compression of the sensor assembly from one side causes both compressible dielectric layers 140 and 170 to deform, which in turn can be detected as a change in capacitance on both sides of the sensor.

It is contemplated that any embodiment discussed in this specification can be implemented with respect to any method of the invention, and vice versa. It will be also understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12, 15, 20 or 25%.

All of the devices and/or methods disclosed and claimed herein can be made and executed without undue experimentation in light of the present disclosure. While the devices and methods of this invention have been described in terms of preferred embodiments, it will be apparent to those of skill in the art that variations may be applied to the devices and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A capacitive tactile sensor for measuring location of touch and force of touch imparted by an external object, said tactile sensor comprising:
   an array of electrodes with a drive electrode layer separated from a sense electrode layer by a dielectric substrate, at least one of said drive electrode layer or said sense electrode layer comprising a plurality of individual electrodes, at least two of said individual electrodes in turn each comprising a group of three or more parallel fine conductors located in a sensing area of said array of electrodes,
   a first deformable conductive shield layer separated from either said drive electrode layer or said sense electrode layer by a first compressible dielectric layer, and
   a control electronics operatively connected to said drive electrode layer, said sense electrode layer, and said first conductive shield layer, said control electronics configured to measure a change in capacitance in groups of said parallel fine conductors via monitoring their corresponding individual electrodes upon imparting local mechanical compression onto said first conductive shield layer and said first compressible dielectric layer by said external object.

2. The tactile sensor as in claim 1, wherein said dielectric substrate separating said drive electrode layer from said sense electrode layer is non-compressible.

3. The tactile sensor as in claim 2, wherein said dielectric substrate has a thickness ranging from 10 microns to 100 microns.

4. The tactile sensor as in claim 1, wherein said array of electrodes is a flexible printed circuit board or printed electronics.

5. The tactile sensor as in claim 4, wherein said drive electrode layer and said sense electrode layer are placed on opposite sides of a polymer thin film forming together said flexible printed circuit board.

6. The tactile sensor as in claim 3, wherein said dielectric substrate is a thin film made from a flexible polymer.

7. The tactile sensor as in claim 6, wherein said flexible polymer is selected from a group consisting of a polyester polymer, a PEEK polymer, a polyimide polymer, and a polyethylene terephthalate polymer.

8. The tactile sensor as in claim 1, wherein said array of electrodes is formed as printed conductive electrodes on said dielectric substrate.

9. The tactile sensor as in claim 1, wherein a ratio of a width of a fine conductor to a gap between adjacent fine conductors in at least some individual electrodes is in a range from 0.5 to 1.5.

10. The tactile sensor as in claim 1, wherein the width of the fine conductor or the gap between adjacent fine conductors is in a range from 25 microns to 100 microns.

11. The tactile sensor as in claim 1, wherein said first compressible dielectric layer has a thickness ranging from 50 microns to 200 microns.

12. The tactile sensor as in claim 1 further comprising a second compressible dielectric layer adjacent to either said sense electrode layer or said drive electrode layer, said second compressible dielectric layer located on the opposite side of said tactile sensor relative to said first compressible dielectric layer.

13. The tactile sensor as in claim 12 further comprising a second deformable conductive shield layer separated from either said drive electrode layer or said sense electrode layer by said second compressible dielectric layer, said second conductive shield layer is operably connected to said control electronics.

14. The tactile sensor as in claim 1, wherein said control electronics is configured to determine said location and force of touch by said external object by detecting attenuation of conductive field formed between said drive electrode layer and said sense electrode layer upon energizing thereof using said control electronics, said attenuation being a result of imparting a depression in said first compressible dielectric layer by said external object.

15. The tactile sensor as in claim 14, wherein said control electronics is configured to use said first conductive shield layer to isolate said conductive field from influence of said external object being in vicinity thereof and regardless of whether said external object is non-conductive, conductive, or grounded.

16. The tactile sensor as in claim 1, wherein said drive electrode layer comprises a plurality of parallel drive electrodes forming rows or said array, said sense electrode layer comprises a plurality of parallel sense electrodes forming columns of said array.

17. A capacitive tactile sensor for measuring location of touch and force of touch imparted by an external object, said tactile sensor comprising:
   an array of electrodes with a drive electrode layer separated from a sense electrode layer by a dielectric substrate, at least one of said drive electrode layer or said sense electrode layer comprising a plurality of individual electrodes, at least two of said individual electrodes in turn each comprising a group of three or more parallel fine conductors located in a sensing area of said array of electrodes,
   a first compressible dielectric layer adjacent to said array of electrodes, and
   a control electronics operatively connected to said drive electrode layer and said sense electrode layer, said control electronics configured to measure a change in capacitance in groups of said parallel fine conductors via monitoring their corresponding individual electrodes upon imparting local mechanical compression onto said first compressible dielectric layer by said external object.

18. The tactile sensor as in claim 17, wherein said array of electrodes is a flexible printed circuit board or printed electronics, and a ratio of a width of a fine conductor to a gap between adjacent fine conductors in at least some individual electrodes of said array of electrodes is in a range from about 0.5 to about 1.5.

19. The tactile sensor as in claim 17 further comprising a second compressible dielectric layer positioned adjacent to said array of electrodes and on the opposite side of said first dielectric compressible layer.

* * * * *